United States Patent
Gan et al.

(10) Patent No.: US 9,178,062 B2
(45) Date of Patent: Nov. 3, 2015

(54) MOS TRANSISTOR, FABRICATION METHOD THEREOF, AND SRAM MEMORY CELL CIRCUIT

(71) Applicant: Semiconductor Manufacturing International Corp., Shanghai (CN)

(72) Inventors: Zhenghao Gan, Shanghai (CN); Zhongshan Hong, Shanghai (CN); Junhong Feng, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 0 days.

(21) Appl. No.: 13/792,251

(22) Filed: Mar. 11, 2013

(65) Prior Publication Data

US 2013/0341642 A1 Dec. 26, 2013

(30) Foreign Application Priority Data

Jun. 26, 2012 (CN) .......................... 2012 1 0214317

(51) Int. Cl.
  *H01L 29/15* (2006.01)
  *H01L 29/78* (2006.01)
  *H01L 29/66* (2006.01)
  *H01L 29/165* (2006.01)
  *H01L 27/11* (2006.01)

(52) U.S. Cl.
  CPC ........ *H01L 29/7848* (2013.01); *H01L 27/1104* (2013.01); *H01L 29/165* (2013.01); *H01L 29/66477* (2013.01); *H01L 29/66636* (2013.01); *H01L 29/66659* (2013.01)

(58) Field of Classification Search
  CPC ............ H01L 29/1054; H01L 29/7378; H01L 29/66659; H01L 29/7835; H01L 29/78624; H01L 29/66477
  USPC ............ 257/77, E29.049, E21.427; 438/300, 438/286, 179
  See application file for complete search history.

(56) References Cited

U.S. PATENT DOCUMENTS

| 7,656,049 B2 * | 2/2010 | Sandhu et al. ................. 257/368 |
| 2002/0074598 A1 * | 6/2002 | Doyle et al. ................... 257/345 |
| 2007/0241411 A1 | 10/2007 | Yang et al. |

(Continued)

OTHER PUBLICATIONS

Ang et al. Strained n-MOSFET With Embedded Source/Drain Stressors and Strain-Transfer Structure (STS) for Enhanced Transistor Performance. IEEE Transactions on Electron Devices, vol. 55, No. 3 (Mar. 2008.* Kah-Wee Ang, King-Jien Chui, Chih-Hang Tung, NBalasubramanian, Ming-Fu Li, Ganesh S. Samudra and Yee-Chia . Yeo "Enhanced Strain Effects in 25-nm Gate-Length Thin-Body nMOSFETs With Silicon—Carbon Source/Drain and Tensile-Stress Liner" IEEE Electron Device Letters, vol. 28, No. 4, pp. 301-304, Apr. 2007.

(Continued)

*Primary Examiner* — Matthew Landau
*Assistant Examiner* — Eric Ashbahian
(74) *Attorney, Agent, or Firm* — Anova Law Group, PLLC (57) ABSTRACT

Various embodiments provide an MOS transistor, a formation method thereof, and an SRAM memory cell circuit. An exemplary MOS transistor can include a channel region including an asymmetric stressing layer having a stress gradually varied from a compressive stress to a tensile stress or from a tensile stress to a compressive stress from a first end of the channel region adjacent to a source region to a second end of the channel region adjacent to a drain region. The MOS transistor can be used as a transfer transistor in an SRAM memory cell circuit to increase a source-drain saturation current in a write operation and to reduce a source-drain saturation current in a read operation. Read and write margins of the SRAM can be increased.

19 Claims, 5 Drawing Sheets

(56) References Cited

U.S. PATENT DOCUMENTS

| | | | |
|---|---|---|---|
| 2008/0054364 A1* | 3/2008 | Hokazono | 257/369 |
| 2008/0310212 A1* | 12/2008 | Greene et al. | 365/156 |
| 2010/0081244 A1* | 4/2010 | Papageorgiou et al. | 438/286 |
| 2012/0161204 A1* | 6/2012 | Flachowsky et al. | 257/192 |
| 2012/0307550 A1* | 12/2012 | Yu et al. | 365/156 |
| 2013/0069111 A1* | 3/2013 | Flachowsky et al. | 257/192 |

OTHER PUBLICATIONS

Jae-Joon Kim, Aditya Bansal, Rahul Rao, Shih-Hsien Lo, Ching-Te Chuang "Relaxing Conflict Between Read Stability and Writability in 6T SRAM Cell Using Asymmetric Transistors" IEEE Electron Device Letters, vol. 30, No. 8, pp. 852-854, Aug. 2009.

* cited by examiner

MOS TRANSISTOR, FABRICATION METHOD THEREOF, AND SRAM MEMORY CELL CIRCUIT

CROSS-REFERENCES TO RELATED APPLICATIONS

This application claims priority to Chinese Patent Application No. CN201210214317.6, filed on Jun. 26, 2012, the entire contents of which are incorporated herein by reference.

FIELD OF THE DISCLOSURE

The present disclosure relates to the field of semiconductor technology and, more particularly, relates to MOS transistors, static random access memory (SRAM) memory cell circuits, and methods for forming the MOS transistors.

BACKGROUND

Static random access memory (SRAM), as one of memory devices, has advantages including high speed, low power consumption, and compatibility with industry standard technologies. SRAM is widely used in areas such as personal computers (PC), personal communications, and consumer electronic products (e.g., smart cards, digital cameras, and multimedia players).

Figure 1:
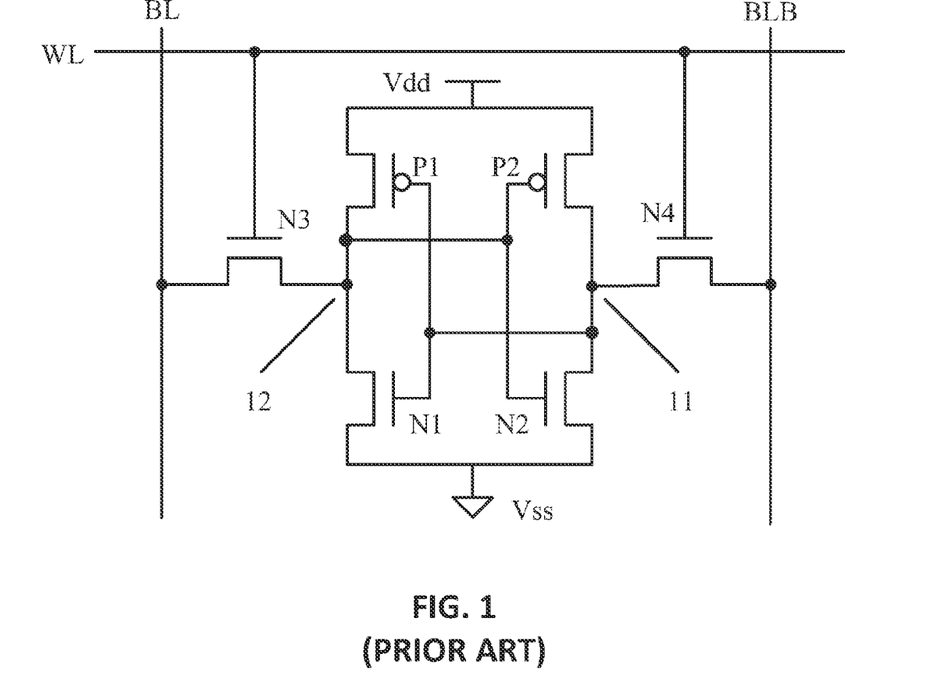
FIG. 1 depicts a schematic illustrating a circuit of a memory cell of a conventional SRAM memory.

FIG. 1 is a schematic illustrating a circuit of a memory cell of a conventional six-transistor (6T) SRAM memory. The memory cell includes a first PMOS transistor P1, a second PMOS transistor P2, a first NMOS transistor N1, a second NMOS transistor N2, a third NMOS transistor N3, and a fourth NMOS transistor N4.

The first PMOS transistor P1, the second PMOS transistor P2, the first NMOS transistor N1, and the second NMOS transistor N2 form a bistable circuit. The bistable circuit forms a latch for latching data information. The first PMOS transistor P1 and the second PMOS transistor P2 are pull-up transistors. The first NMOS transistor N1 and the second NMOS transistor N2 are pull-down transistors. The third NMOS transistor N3 and the fourth NMOS transistor N4 are transfer transistors.

A gate of the first PMOS transistor P1, a gate of the first NMOS transistor N1, a drain of the second PMOS transistor P2, a drain of the second NMOS transistor N2, and a source of the fourth NMOS transistor N4 are electrically connected forming a first storage node 11. A gate of the second PMOS transistor P2, a gate of the second NMOS transistor N2, a drain of the first PMOS transistor P1, a drain of the first NMOS transistor N1, and a source of the third NMOS transistor N3 are electrically connected forming a second storage node 12.

Gates of the third NMOS transistor N3 and the fourth NMOS transistor N4 are electrically connected to a word line WL. A drain of the third NMOS transistor N3 is electrically connected to a first bit line BL. A drain of the fourth NMOS transistor N4 is electrically connected to a second bit line (complementary bit line) BLB. A source of the first PMOS transistor P1 and a source of the second PMOS transistor P2 are electrically connected to a power supply line Vdd. A source of the first NMOS transistor N1 and a source of the second NMOS transistor N2 are electrically connected to a ground line Vss. The operating principle of the memory cell of the 6T SRAM memory is as follows.

In a read operation, the word line WL is set at a high level so that the third NMOS transistor N3 and the fourth NMOS transistor N4 become conductive. The first bit line BL and the second bit line BLB are set at a high level. One of the first storage node 11 and the second storage node 12 is set at a low level. Therefore, a current flows from the first bit line BL and the second bit line BLB to the first storage node 11 or the second storage node 12 that is set at a low level. The electric potential of the first bit line BL or the second bit line BLB decreases so that a voltage is generated between the electric potentials of the first bit line BL and the second bit line BLB. After the voltage reaches a certain value, a sensitivity amplifier (not shown) is activated to amplify the voltage and then transfers the voltage to an output circuit (not shown) for data reading.

In a write operation, the word line WL is set at a high level so that the third NMOS transistor N3 and the fourth NMOS transistor N4 become conductive. One of the first bit line BL and the second bit line BLB is set at a high level and the other is set at a low level. One of the first storage node 11 and the second storage node 12 is at a high level and the other is at a low level. When data information of the write operation is different from originally stored data information, a current may flow from, the first storage node 11 or the second storage node 12 that is set at a high level, to the first bit line BL or the second bit line BLB that is set at a low level. Therefore, the electric potential of the one set at a high level of the first storage node 11 and the second storage node 12 is decreased. The electric potential of the other one set at a low level of the first storage node 11 and the second storage node 12 is increased. New data are thus stored in the SRAM memory cell.

However, SRAM memories face challenges in reading/writing stability, as process node shrinks in complementary metal-oxide-semiconductor (CMOS) manufacturing processes with reduced operating voltages and increased variations of threshold voltages due to random doping. To allow an SRAM memory to be stably operated, it is necessary to increase read and write margins of the SRAM memory.

Therefore, there is a need to provide MOS transistors, SRAM memory cell circuits, and fabrication methods to at least increase read and write margins of an SRAM memory.

BRIEF SUMMARY OF THE DISCLOSURE

According to various embodiments, there is provided an MOS transistor. The MOS transistor can include a semiconductor substrate; a gate structure disposed on the semiconductor substrate; a source region disposed in the semiconductor substrate on one side of the gate structure; a drain region disposed in the semiconductor substrate on an other side of the gate structure; and a channel region between the source region and the drain region. The channel region can include an asymmetric stressing layer having a stress gradually varied from a compressive stress to a tensile stress or from a tensile stress to a compressive stress from a first end of the channel region adjacent to the source region to a second end of the channel region adjacent to the drain region.

According to various embodiments, there is also provided a method of forming an MOS transistor. The MOS transistor can be formed by first forming a gate structure on a semiconductor substrate. A tensile stressing layer can then be formed in the semiconductor substrate on one side of the gate structure. A compressive stressing layer can be formed in the semiconductor substrate on an other side of the gate structure to provide a region between the compressive stressing layer and the tensile stressing layer with a stress gradually varied from a compressive stress to a tensile stress.

According to various embodiments, there is further provided an SRAM memory cell circuit. The SRAM memory cell circuit can include a first transfer transistor and a second transfer transistor. The first transfer transistor can include a gate electrically connected to a word line, a source electrically connecting to a first storage node, and a drain electrically connecting to a first bit line. The second transfer transistor can include a gate electrically connected to the word line, a source electrically connecting to a second storage node, and a drain electrically connecting to a second bit line. Each of the first transfer transistor and the second transfer transistor can include a channel region. The channel region can include an asymmetric stressing layer having a stress gradually varied from a compressive stress to a tensile stress or from a tensile stress to a compressive stress from a first end of the channel region adjacent to the source region to a second end of the channel region adjacent to the drain region.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Read and write stability of an SRAM memory can mainly be measured by, for example, parameters including read margin and write margin. The higher the read and write margins, the better the read and write stability of the SRAM memory. The read margin can depend on a ratio between a source-drain saturation current of a pull-down NMOS transistor and a source-drain saturation current of a transfer NMOS transistor. The write margin can depend on a ratio between the source-drain saturation current of the transfer NMOS transistor and a source-drain saturation current of a pull-up PMOS transistor.

When structures of the pull-up PMOS transistor and the pull-down NMOS transistor are kept unchanged or consistent, the read margin can be increased by decreasing a drain-to-source source-drain saturation current of the transfer NMOS transistor. When the structures of the pull-up PMOS transistor and the pull-down NMOS transistor are kept unchanged or consistent, the write margin can be increased by increasing a source-to-drain source-drain saturation current of the transfer NMOS transistor. The source and drain of each of the transfer NMOS transistors (e.g., the third NMOS transistor N3 and the fourth NMOS transistor N4 as shown in FIG. 1) are often symmetric. Accordingly, the source-to-drain source-drain saturation current and the drain-to-source source-drain saturation current of the transfer NMOS transistors should be the same. Therefore, using the transfer NMOS transistor to increase both the write margin and the read margin is contradictory. That is, increasing the read margin of the transfer NMOS transistor will result in decreasing of the write margin, and vice versa.

Various embodiments provide structures and methods for forming MOS transistors including an asymmetric stressing layer. An exemplary MOS transistor can include a channel region including an asymmetric stressing layer with asymmetric stress. In various embodiments, stress in source and drain regions of an exemplary MOS transistor can be asymmetric. Various embodiments also provide an SRAM memory cell circuit using the MOS transistor as a transfer transistor (or a pass gate transistor).

Exemplary MOS transistor can include a semiconductor substrate, a gate structure formed on the semiconductor substrate, a source region formed in the semiconductor substrate on one side of the gate structure, and a drain region formed in the semiconductor substrate on the other side of the gate structure. A stress in a channel region, formed between the source region and the drain region, can be gradually varied from a compressive stress to a tensile stress (or from a tensile stress to a compressive stress) from a first end of the channel region near the source region to a second end of the channel region near the drain region. When the MOS transistor is in a saturation region and a source-drain voltage is greater than or equal to a source-drain saturation voltage, the channel region can be pinched off. The channel region can then only exist between a channel pinch-off point and the source region or the drain region, that is set at a low level.

Therefore, saturation mobility of carriers of the MOS transistor depends on saturation mobility of carriers in the channel region near the source region or the drain region, that is set at the low level. The type of the stress in the channel region between the source and drain regions can gradually change from a compressive stress to a tensile stress (or from a tensile stress to a compressive stress) from a first end of the channel region near the source region to a second end of the channel region near the drain region. Therefore, when the channel region is near the source region or near the drain region, the carriers can have different saturation mobility in a different depletion region. The source-drain saturation current of the MOS transistor can vary in different current directions. Using an MOS transistor having a varied source-drain saturation current in a different current direction as a transfer transistor of an SRAM memory cell circuit can simultaneously increase both the read margin and the write margin of the SRAM memory cell.

Figure 2:
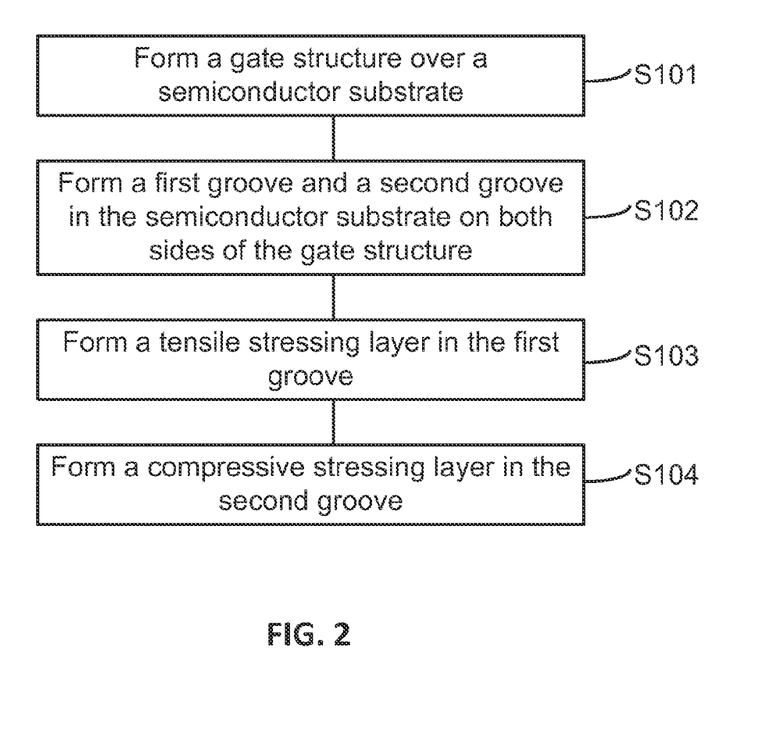
FIG. 2 depicts an exemplary method for forming an MOS transistor in accordance with various disclosed embodiments.

FIG. 2 depicts an exemplary method for forming an MOS transistor, and FIGS. 3-6 depict cross-sectional views of an exemplary MOS transistor at various stages during its formation in accordance with various disclosed embodiments. Note that although FIGS. 3-6 depict structures corresponding to the method depicted in FIG. 2, the structures and the method are not limited in any manner. The MOS transistor can be an NMOS transistor or a PMOS transistor. The MOS transistor can be used as a transfer transistor in an SRAM memory cell circuit.

Figure 3:
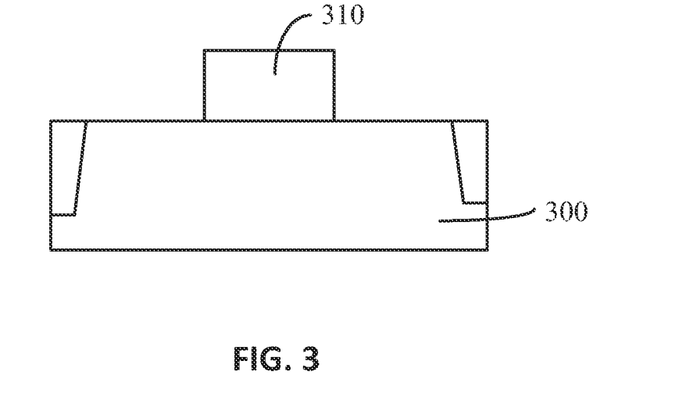
FIGS. 3-6 depict schematic cross-sectional views of an exemplary MOS transistor at various stages during its formation in accordance with various disclosed embodiments.

In Step S101 of FIG. 2 and referring to FIG. 3, a semiconductor substrate 300 can be provided. A gate structure 310 can be formed over/on a surface of the semiconductor substrate 300.

The semiconductor substrate 300 can be a single-crystal silicon substrate, a single-crystal germanium substrate, a silicon germanium substrate, and/or a silicon-on-insulator (SOI) substrate. An isolation structure (not shown), e.g., a shallow trench isolation structure, can be formed in the semiconductor substrate 300. The shallow trench isolation structure can be located between adjacent devices to electrically isolate the adjacent devices.

The gate structure 310 can include, for example, a gate dielectric layer, a gate electrode, and/or a sidewall spacer. The gate dielectric layer can be formed on the semiconductor substrate 300. The gate electrode can be formed on the gate dielectric layer. The sidewall spacer can be formed on sidewall surfaces of the gate dielectric layer and the gate electrode. The gate dielectric layer can be made of silicon oxide and/or high-K gate dielectric material including, e.g., hafnium oxide and/or zirconium oxide. The gate electrode can be, e.g., a polycrystalline silicon gate electrode or a metal gate electrode.

Figure 4:
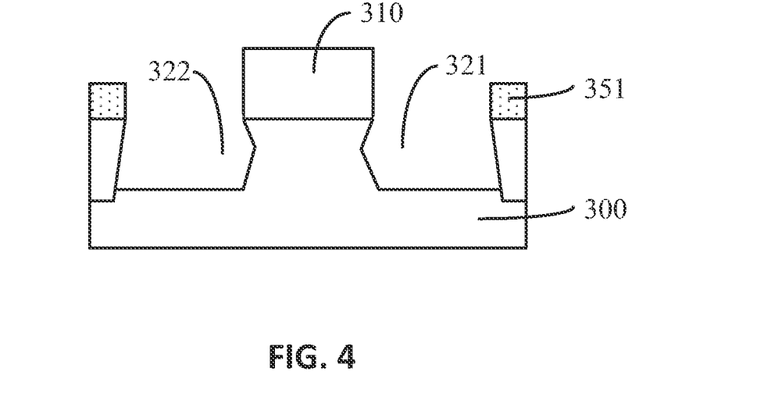

In Step S102 of FIG. 2 and referring to FIG. 4, a first groove 321 can be formed in the semiconductor substrate 300 on one side of the gate structure 310, and a second groove 322 can be formed in the semiconductor substrate 300 on the other side of the gate structure 310. As used herein, the term groove can be an opening having any suitable shapes and/or dimensions formed in a semiconductor substrate. A groove can therefore be a trench, a hole, etc.

The first groove 321 and the second groove 322 can be formed by, e.g., wet etching, dry etching, or a combination of wet etching and dry etching. In one embodiment, the first groove 321 and the second groove 322 can be formed by, e.g., forming a first photoresist layer 351 on the surface of the semiconductor substrate 300; dry etching the semiconductor substrate 300 on both sides of the gate structure 310 to form rectangular grooves (not shown) by using the first photoresist layer 351 and the gate structure 310 as a mask; and wet etching the rectangular grooves to form the first groove 321 in the semiconductor substrate 300 on the one side of the gate structure 310 and to form the second groove 322 in the semiconductor substrate 300 on the other side of the gate structure 310, such that a sidewall of each of the first groove 321 and the second groove 322, e.g., having a Σ-shape or other suitable shapes.

In one embodiment, since the wet etching is isotropic, the first groove 321 and the second groove 322 can each protrude toward the channel region under the gate structure 310. In various embodiments, the protruded sidewall can have a protrusion length toward the channel region, e.g., from a sidewall position perpendicular to substrate surface to a maximum point of the protrusion in a direction parallel to the substrate surface. In one embodiment, the protrusion length can be in a range of from about 10 nm to about 40 nm without limitation.

When a compressive stressing layer such as a silicon germanium (SiGe) layer or a tensile stressing layer such as a silicon carbide (SiC) layer is subsequently formed in the first groove 321 and the second groove 322, the silicon germanium layer or the silicon carbide layer that protrudes toward the channel region can further increase a stress in a channel region. After forming the first groove 321 and the second groove 322, the first photoresist layer 351 can be removed, e.g., by an ashing process.

Figure 5:
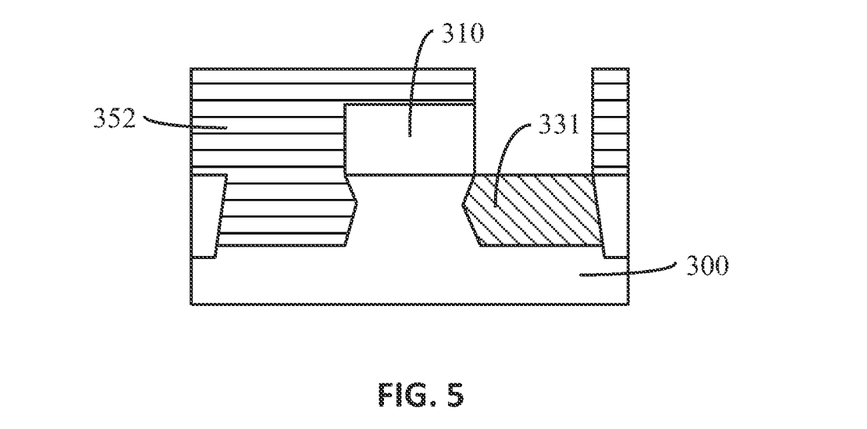

In Step S103 of FIG. 2 and referring to FIG. 5, a first barrier layer 352 can be formed on surfaces of the semiconductor substrate 300 and the gate structure 310. The first barrier layer 352 can expose the first groove 321 (e.g., as shown in FIG. 4). A tensile stressing layer such as a silicon carbide layer 331 can then be filled in the first groove 321.

The silicon carbide layer 331 can be formed by using selective epitaxy including, e.g., vapor phase epitaxy and/or solid phase epitaxy. In one embodiment, the first barrier layer 352 and the silicon carbide layer 331 can be formed by a process including, for example, forming a barrier material (not shown) on surfaces of the semiconductor substrate 300 and the gate structure 310; forming a patterned photoresist layer (not shown) on the barrier material; etching the barrier material by using the patterned photoresist layer as a mask to form the first barrier layer 352, the first barrier layer 352 exposing the first groove 321; and removing the patterned photoresist layer. The first barrier layer 352 can be a silicon oxide layer, a bottom anti-reflective coating layer, and/or the like. Thereafter, silicon carbide can be filled in the first groove 321 by using, e.g., vapor phase epitaxy to form the silicon carbide layer 331.

During the exemplary vapor phase epitaxy, a reactive gas can be used to contain n-type impurity ions or p-type impurity ions so that the silicon carbide layer 331 can be in-situ doped with desired n-type or p-type impurity ions. The silicon carbide layer 331 can be a source region or a drain region of the MOS transistor. Carbon content may be the same or different at different regions in the silicon carbide layer 331. In one embodiment, the silicon carbide layer 331 can have a carbon concentration ranging from about 0% to about 50% by mole percentage of the total silicon carbide layer. In various embodiments, magnitude of a tensile stress in the channel region can be controlled by varying the carbon concentration (e.g., the mole percentage) in the silicon carbide layer 331. After forming the silicon carbide layer 331, the first barrier layer 352 can be removed.

Figure 6:
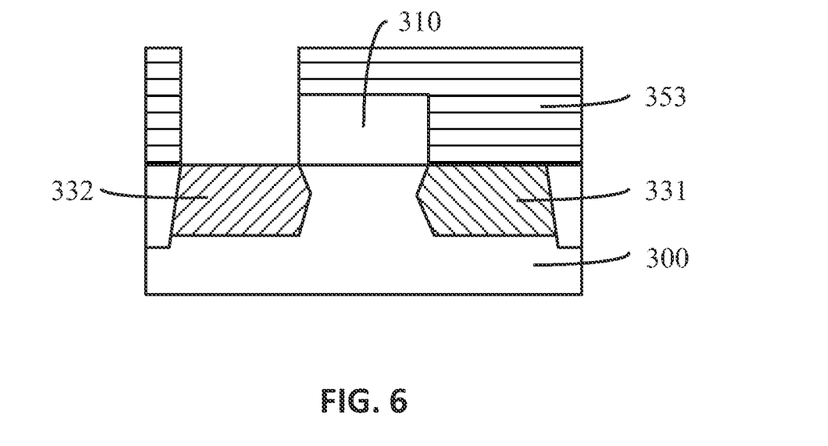

In Step S104 of FIG. 2 and referring to FIG. 6, a second barrier layer 353 can be formed on surfaces of the semiconductor substrate 300 and the gate structure 310. The second barrier layer 353 can expose the second groove 322 (e.g., as shown in FIG. 4). A compressive stressing layer such as a silicon germanium layer 332 can then be filled in the second groove 322.

The silicon germanium layer 332 can be formed by using selective epitaxy including, e.g., vapor phase epitaxy and/or solid phase epitaxy. In one embodiment, the second barrier layer 353 and the silicon germanium layer 332 can be formed by a process including, e.g., forming a barrier material (not shown) on surfaces of the semiconductor substrate 300 and the gate structure 310; forming a patterned photoresist layer (not shown) on surface of the barrier material; etching the barrier material by using the patterned photoresist layer as a mask to form the second barrier layer 353, the second barrier layer 353 exposing the second groove 322; and removing the pattern photoresist layer. The second barrier layer 353 can be a silicon oxide layer, a bottom anti-reflective coating layer, and/or the like. Thereafter, silicon germanium can be filled in the second groove 322, e.g., by using vapor phase epitaxy, to form the silicon germanium layer 332.

During the exemplary vapor phase epitaxy, a reactive gas can be used to contain n-type impurity ions or p-type impurity ions so that the silicon germanium layer 332 can be in-situ doped with desired impurity ions. The silicon germanium layer 332 can be a drain region or a source region of the MOS transistor. In one embodiment, the impurity ions doped in the silicon germanium layer 332 and the impurity ions doped in the silicon carbide layer 331 can be the same type. Germanium concentration may be the same or different at different regions in the silicon germanium layer 332. In one embodiment, the silicon germanium layer 332 can have a germanium concentration ranging from about 0% to about 70% by mole percentage of the total silicon germanium layer 332. Magnitude of a compressive stress in the channel region can be controlled by varying the germanium concentration (e.g., the mole percentage) in the silicon germanium layer 332. After forming the silicon germanium layer 332, the second barrier layer 353 can be removed.

In some embodiments, the silicon germanium layer can be formed first, followed by forming the silicon carbide layer, or vice versa. In other embodiments, after forming the gate structure, the silicon germanium layer and the silicon carbide layer may be formed by ion implantation processes including, for example, implanting germanium ions into a semiconductor substrate (e.g., a silicon substrate) on one side of the gate structure and implanting carbon ions into the semiconductor substrate on the other side of the gate structure by using a photoresist as a mask to form a silicon carbide layer in the semiconductor substrate on the one side of the gate structure and to form a silicon germanium layer in the semiconductor substrate on the other side of the gate structure. After forming the silicon germanium layer and the silicon carbide layer, the silicon germanium layer and the silicon carbide layer may further be subjected to n-type or p-type ion implantations. One of the silicon germanium layer and the silicon carbide layer can be one of a source region and a drain region of the MOS transistor.

Figure 7:
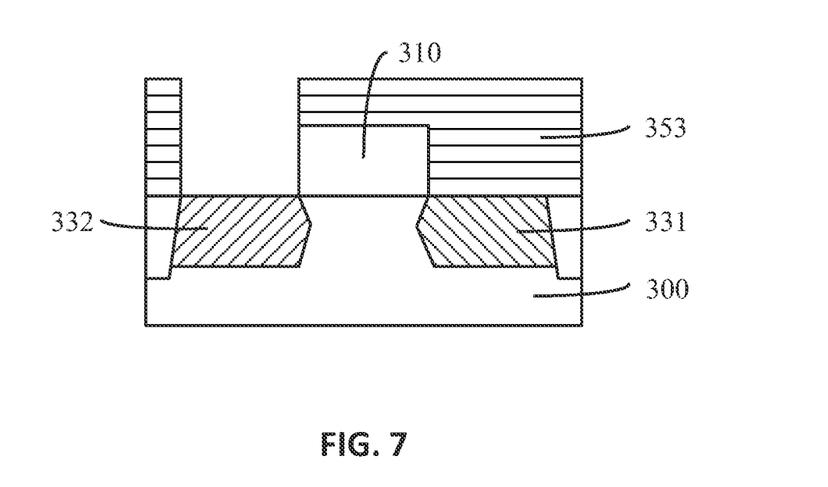
FIG. 7 depicts a schematic cross-sectional view of an exemplary MOS transistor in accordance with various disclosed embodiments.

FIG. 7 depicts a cross-sectional view of the MOS transistor in accordance with various disclosed embodiments. Specifically, the MOS transistor can include a semiconductor substrate 300; a gate structure 310 formed on the semiconductor substrate 300; a silicon carbide layer 331 formed in the semiconductor substrate 300 on one side of the gate structure 310; and a silicon germanium layer 332 formed in the semiconductor substrate 300 on the other side of the gate structure 310. The silicon carbide layer 331 and the silicon germanium layer 332 can be doped with suitable impurity ions. One of the silicon carbide layer 331 and the silicon germanium layer 332 can be one of source and drain regions of the MOS transistor.

The MOS transistor can be an NMOS transistor and, accordingly, the impurity ions doped in the source/drain regions can be n-type impurity ions. The MOS transistor can also be a PMOS transistor and, accordingly, the impurity ions doped in the source/drain regions can be p-type impurity ions.

One of the silicon carbide layer 331 and the silicon germanium layer 332 can be the source region of the MOS transistor and the other can be the drain region of the MOS transistor. The silicon carbide layer 331 and the silicon germanium layer 332 can protrude toward the channel region to increase a tensile stress in the channel region that is near the silicon carbide layer 331 and to increase a compressive stress in the channel region that is near the silicon germanium layer 332.

In various embodiments, the compressive stress generated in the middle of the channel region by the silicon germanium layer 332 and the tensile stress generated in the middle of the channel region by the silicon carbide layer 331 can be the same or different in magnitude. By adjusting the magnitude of the compressive stress generated in the silicon germanium layer and adjusting the magnitude of the tensile stress generated in the silicon carbide layer, the source-drain saturation currents in different current directions can be controlled. The read and write margins of the SRAM memory cell can then be controlled.

One of the source and drain regions of the MOS transistor can be the silicon germanium layer and the other can be the silicon carbide layer. The stress in the channel region near the silicon germanium layer 332 can be a compressive stress, and the stress in the channel region near the silicon carbide layer 331 can be a tensile stress. Therefore, the stress in the channel region between the silicon carbide layer 311 and the silicon germanium layer 332 can be gradually varied from a tensile stress to a compressive stress from one end of the channel region near the silicon carbide layer 331 to the other end of the channel region near the silicon germanium layer 332.

The compressive stress can be the largest in the channel region that is the nearest to the silicon germanium layer 332. The farther away from the silicon germanium layer 332, the smaller the compressive stress is generated in the channel region. In the middle region of the channel region, the compressive stress can become zero. The tensile stress can be the largest in the channel region that is the nearest to the silicon carbide layer 331. The farther away from the silicon carbide layer 331, the smaller the tensile stress is generated in the channel region. In the middle region of the channel region, the tensile stress can become zero. Different types and magnitudes of the stress in the channel region can have different influences on the saturation mobility of the carriers in the channel region.

In one embodiment, the stress in the channel region near the silicon germanium layer 332 can be a compressive stress, and the compressive stress can be the largest in the channel region that is the nearest to the silicon germanium layer 332. Therefore in the channel region that is nearest to the silicon germanium layer 332, the saturation mobility of holes can be the largest and the saturation mobility of electrons can be the smallest. On the other hand, the tensile stress can be the largest in the channel region that is the nearest to the silicon carbide layer 331. Therefore, in the channel region that is the nearest to the silicon carbide layer 331, the saturation mobility of electrons can be the largest and the saturation mobility of holes can be the smallest.

When the MOS transistor is in a saturation region and a source-drain voltage is greater than or equal to a saturation source-drain voltage, the channel region can be pinched off. The channel region can then only exist between a channel pinch-off point and the source region or the drain region that is set at a low level. Saturation mobility of carriers of the MOS transistor depends on saturation mobility of carriers in the channel region near the source region or the drain region that is set at the low level. The channel region can be located near the source region or the drain region, and the stress in the channel region near the source region or the drain region can be of a different type and have a different magnitude. Therefore, carriers in a depletion region can have different saturation mobility in a different current direction. The source-drain saturation current of the MOS transistor can thus be different in a different current direction.

When the MOS transistor is an NMOS transistor and a current flows from the silicon carbide layer 331 to the silicon germanium layer 332, the source-drain saturation current can be reduced, e.g., lower than the source-drain saturation current of a conventional MOS transistor.

When the MOS transistor is an NMOS transistor and a current flows from the silicon germanium layer 332 to the silicon carbide layer 331, the source-drain saturation current can be increased, e.g., greater than the source-drain saturation current of the conventional MOS transistor.

When the MOS transistor is a PMOS transistor and a current flows from the silicon germanium layer 332 to the silicon carbide layer 331, the source-drain saturation current can be reduced, e.g., lower than the source-drain saturation current of the conventional MOS transistor.

When the MOS transistor is a PMOS transistor and a current flows from the silicon carbide layer 331 to the silicon germanium layer 332, the source-drain saturation current is increased, e.g., greater than the source-drain saturation current of the conventional MOS transistor.

The disclosed MOS transistor can be used as a transfer transistor of an SRAM memory cell. Because the source-drain saturation current passing through such transfer transistor in one current direction can be larger than that in another current direction, both the read and write margins of the SRAM memory cell can be increased at the same time.

Figure 8:
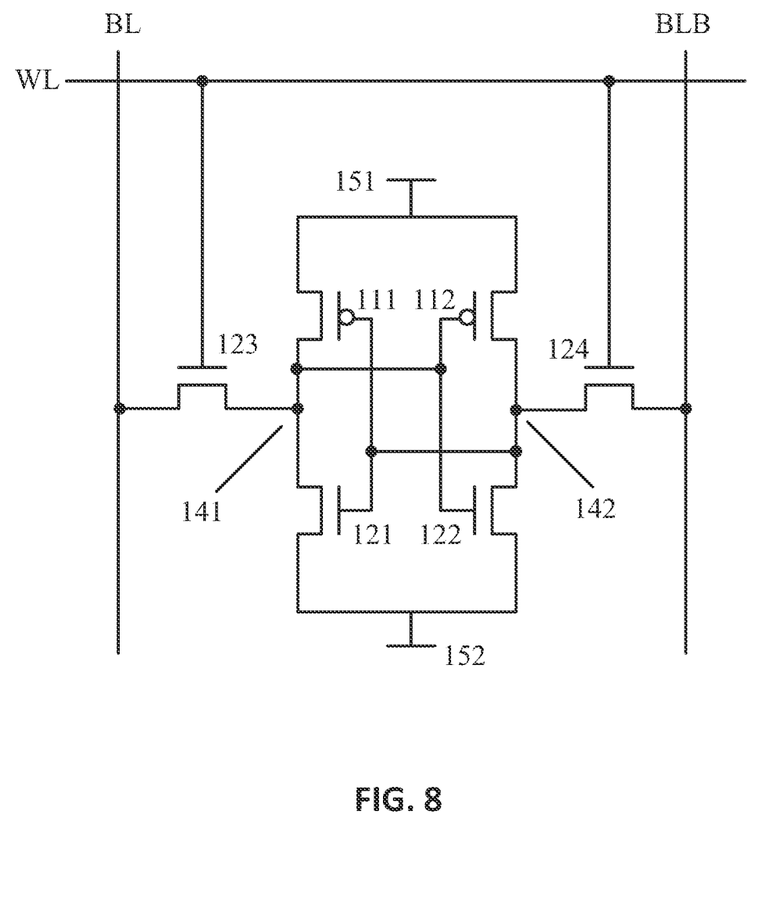
FIG. 8 depicts an exemplary SRAM memory cell circuit in accordance with various disclosed embodiments.

As disclosed herein, an SRAM memory cell circuit can be formed using the MOS transistor as a transfer transistor. FIG. 8 depicts a schematic structural diagram of an exemplary SRAM memory cell circuit in accordance with various disclosed embodiments.

As shown in FIG. 8, SRAM memory cell circuit can include, for example, a first PMOS transistor 111, a second PMOS transistor 112, a first NMOS transistor 121, a second NMOS transistor 122, a third NMOS transistor 123 and/or a fourth NMOS transistor 124.

A gate of the second PMOS transistor 112, a gate of the second NMOS transistor 122, a drain of the first PMOS transistor 111, a drain of the first NMOS transistor 121, and a source of the third NMOS transistor 123 can be electrically connected to form a first storage node 141. A gate of the first PMOS transistor 111, a gate of the first NMOS transistor 121, a drain of the second PMOS transistor 112, a drain of the second NMOS transistor 122, and a source of the fourth NMOS transistor 124 can be electrically connected to form a second storage node 142. The first PMOS transistor 111, the second PMOS transistor 112, the first NMOS transistor 121, and the second NMOS transistor 122 can form a bistable circuit. The first PMOS transistor 111 and the second PMOS transistor 112 can be pull-up transistors. The first NMOS transistor 121 and the second NMOS transistor 122 can be pull-down transistors.

The third NMOS transistor 123 and the fourth NMOS transistor 124 can be used as transfer transistors and can connect a first bit line BL and a second bit line BLB with the bistable circuit. Gates of the third NMOS transistor 123 and the fourth NMOS transistor 124 can be electrically connected to a word line WL. A drain of the third NMOS transistor 123 can be electrically connected to the first bit line BL. A drain of the fourth NMOS transistor 124 can be electrically connected to the second bit line (complementary bit line) BLB. A source of the first PMOS transistor 111 and a source of the second PMOS transistor 112 can be electrically connected to a power supply terminal 151. A source of the first NMOS transistor 121 and a source of the second NMOS transistor 122 can be electrically connected to a ground terminal 152.

A source region corresponding to the source of each of the third NMOS transistor 123 and the fourth NMOS transistor 124 can be a silicon germanium layer. A drain region corresponding to the drain of each of the third NMOS transistor 123 and the fourth NMOS transistor 124 can be a silicon carbide layer.

Specifically, the first PMOS transistor 111 and the second PMOS transistor 112 can have same or similar device structures. The first NMOS transistor 121 and the second NMOS transistor 122 can have same or similar device structures. The third NMOS transistor 123 and the fourth NMOS transistor 124 can have same or similar device structure.

Both the silicon germanium layer and the silicon carbide layer in each of the third NMOS transistor 123 and the fourth NMOS transistor 124 can be doped with n-type impurity ions. In addition, a sidewall of each of the silicon germanium layer and the silicon carbide layer can protrude toward a channel region. Therefore, a tensile stress in a channel region near the silicon carbide layer can be increased and a compressive stress in a channel region near the silicon germanium layer can also be increased.

A source region corresponding to a source of each of the third NMOS transistor 123 and the fourth NMOS transistor 124 can be a silicon germanium layer. A drain region corresponding to a drain of each of the third NMOS transistor 123 and the fourth NMOS transistor 124 can be a silicon carbide layer. Therefore, a stress in each of the third NMOS transistor 123 and the fourth NMOS transistor 124 can be gradually varied from a compressive stress to a tensile stress from a first end near the source region to a second end near the drain region. The compressive stress can be the largest in a channel region that is the nearest to the source region. The farther away from the source region, the smaller the compressive stress in a channel region. After the compressive stress becomes zero, the nearer to the drain region, the larger a tensile stress in a channel region. The tensile stress can be the largest in a channel region that is the nearest to the drain region.

In a read operation of the SRAM memory, the first bit line BL and the second bit line BLB can be set at a high level to allow a current to flow from the first bit line BL and the second bit line BLB to, the first storage node 141 or the second storage node 142, that is set at a low level. When the current in the channel region in each of the third NMOS transistor 123 and the fourth NMOS transistor 124 is the source-drain saturation current, that is, when the third NMOS transistor 123 and the fourth NMOS transistor 124 are in a saturation region, the channel region can be pinched off.

A channel region can thus be formed between the channel pinch-off point and a source region that is set at a low level. The source-drain saturation current of the third NMOS transistor 123 and the fourth NMOS transistor 124 in the read operation depends on saturation mobility of the carriers in the channel region. The channel region can be near the source region, the stress in the source region can be a compressive stress, and the transfer transistor can be an NMOS transistor. Therefore, the source-drain saturation current of the third NMOS transistor 123 and the fourth NMOS transistor 124 in the read operation can be reduced, e.g., smaller than the source-drain saturation current of a conventional MOS transistor.

On the other hand, the read margin of the SRAM memory cell depends on a ratio between the source-drain saturation current of the pull-down NMOS transistors (e.g., the first NMOS transistor 121 and the second NMOS transistor 122) and the source-drain saturation current of the transfer NMOS transistors (e.g., the third NMOS transistor 123 and the fourth NMOS transistor 124). Since the source-drain saturation current of the transfer NMOS transistors can become smaller, the read margin of the SRAM memory cell can become larger. Stability of a read operation of the SRAM memory cell can be increased.

In a write operation of the SRAM memory, a current can flow from the first storage node 141 or the second storage node 142 that is set at high level to the first bit line BL or the second bit line BLB that is set at a low level. In the write operation, the channel region can be near the drain region, the stress in the drain region can be a tensile stress, and the transfer transistor can be an NMOS transistor. Therefore, the source-drain saturation current of the third NMOS transistor 123 and the fourth NMOS transistor 124 in the write operation can be increased, e.g., larger than the source-drain saturation current of a conventional MOS transistor.

On the other hand, the write margin of the SRAM memory cell depends on a ratio between the source-drain saturation current of the transfer NMOS transistors (e.g., the third NMOS transistor 123 and the fourth NMOS transistor 124) and the source-drain saturation current of the pull-up PMOS transistors (e.g., the first PMOS transistor 111 and the second PMOS transistor 112). Since the source-drain saturation current of the transfer NMOS transistors can become large, the write margin of the SRAM memory cell can become large. Stability of a write operation of the SRAM memory cell can be increased.

In a specific embodiment where transfer (or pass-gate) NMOS transistors (e.g., the third NMOS transistor 123 and the fourth NMOS transistor 124) are configured in a 6-transistor (6T) SRAM as shown in FIG. 8, an exemplary SiGe source can be connected to the internal nodes such as the storage nodes 141 and 142, while an exemplary SiC drain can be connected to the bit-lines (BL). Large source-to-drain current and small source-to-drain current can thus be provided.

Therefore, using the disclosed MOS transistor as a transfer transistor in an SRAM memory cell circuit can allow both the read margin and the write margin of the SRAM memory cell to be increased at the same time. Stability of the SRAM memory cell can be increased.

Figure 9:
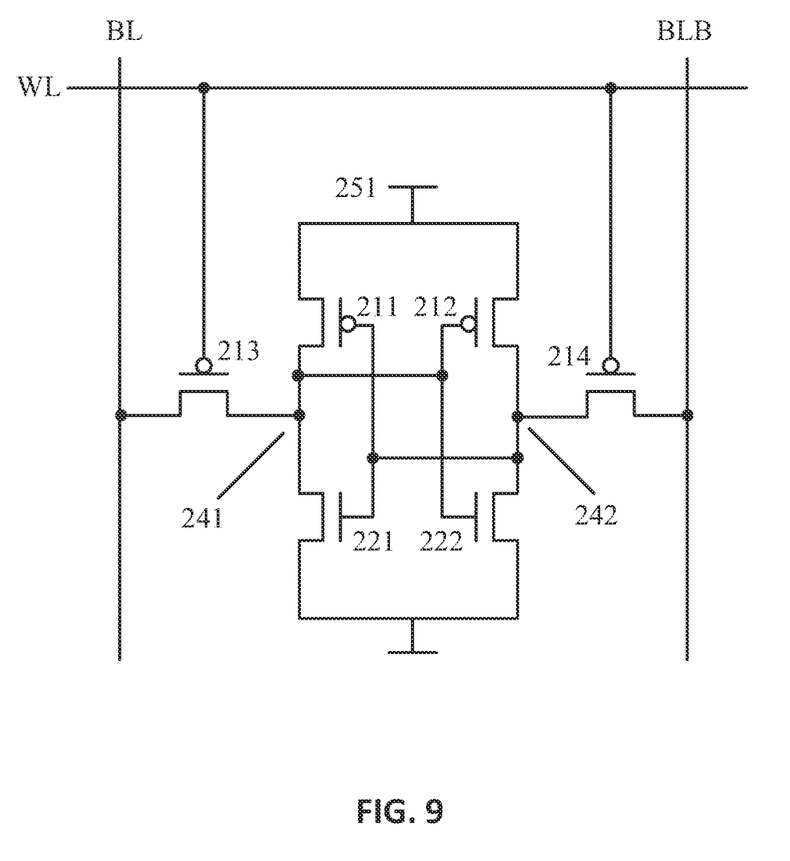
FIG. 9 depicts another exemplary SRAM memory cell circuit in accordance with various disclosed embodiments.

In various embodiments, another exemplary SRAM memory cell circuit can be provided using the disclosed MOS transistor as a transfer transistor. FIG. 9 depicts a schematic structural diagram of another exemplary SRAM memory cell circuit in accordance with various disclosed embodiments.

As shown in FIG. 9, SRAM memory cell circuit can include, for example, a first PMOS transistor 211, a second PMOS transistor 212, a third PMOS transistor 213, a fourth PMOS transistor 214, a first NMOS transistor 221, and/or a second NMOS transistor 222.

A gate of the second PMOS transistor 212, a gate of the second NMOS transistor 222, a drain of the first PMOS transistor 211, a drain of the first NMOS transistor 221, and a source of the third PMOS transistor 213 can be electrically connected to form a first storage node 241. A gate of the first PMOS transistor 211, a gate of the first NMOS transistor 221, a drain of the second PMOS transistor 212, a drain of the second NMOS transistor 222, and a source of the fourth PMOS transistor 214 can be electrically connected to form a second storage node 242.

The first PMOS transistor 211, the second PMOS transistor 212, the first NMOS transistor 221, and the second NMOS transistor 222 can form a bistable circuit. The first PMOS transistor 211 and the second PMOS transistor 212 can be pull-up transistors. The first NMOS transistor 221 and the second NMOS transistor 222 can be pull-down transistors.

The third PMOS transistor 213 and the fourth PMOS transistor 214 can be used as transfer transistors and can connect a first bit line BL and a second bit line BLB with the bistable circuit. Gates of the third PMOS transistor 213 and the fourth PMOS transistor 214 can be electrically connected to a word line WL. A drain of the third PMOS transistor 213 can be electrically connected to a first bit line BL and a drain of the fourth PMOS transistor 214 can be electrically connected to a second bit line (complementary bit line) BLB. A source of the first PMOS transistor 211 and a source of the second PMOS transistor 212 can be electrically connected to a power supply terminal 251. A source of the first NMOS transistor 221 and a source of the second NMOS transistor 222 can be electrically connected to a ground terminal 252.

A source region corresponding to the source of each of the third PMOS transistor 213 and the fourth PMOS transistor 214 can be a silicon carbide layer. A drain region corresponding to the drain of each of the third PMOS transistor 213 and the fourth PMOS transistor 214 can be a silicon germanium layer.

Specifically, the first PMOS transistor 211 and the second PMOS transistor 212 can have same or similar device structures. The first NMOS transistor 221 and the second NMOS transistor 222 can have same or similar device structures. The third PMOS transistor 213 and the fourth PMOS transistor 214 can have same or similar device structures.

Both the silicon germanium layer and the silicon carbide layer in each of the third PMOS transistor 213 and the fourth PMOS transistor 214 can be doped with p-type impurity ions. In addition, a sidewall of each of the silicon germanium layer and the silicon carbide layer can protrude toward a channel region side. Therefore, a tensile stress in a channel region near the silicon carbide layer can be increased and a compressive stress in a channel region near the silicon germanium layer can be increased.

A source region corresponding to a source of each of the third PMOS transistor 213 and the fourth PMOS transistor 214 can be a silicon carbide layer. A drain region corresponding to a drain of each of the third PMOS transistor 213 and the fourth PMOS transistor 214 can be a silicon germanium layer. Therefore, a stress in each of the third PMOS transistor 213 and the fourth PMOS transistor 214 can be gradually varied from a tensile stress to a compressive stress from one end near the source region to one end near the drain region. The tensile stress can be the largest in a channel region that is the nearest to the source region. The farther away from the source region, the smaller the tensile stress in a channel region. After the tensile stress becomes zero, the nearer to the drain region, the larger a compressive stress in a channel region. The compressive stress can be the largest in a channel region that is the nearest to the drain region.

In a read operation of the SRAM memory, the first bit line BL and the second bit line BLB can be set at a high level to allow a current to flow from the first bit line BL and the second bit line BLB to the first storage node 241 or the second storage node 242 that is set at a low level. When the current in the channel region in each of the third PMOS transistor 213 and the fourth PMOS transistor 214 is the source-drain saturation current, that is, when the third PMOS transistor 213 and the fourth PMOS transistor 214 are in a saturation region, the channel region can be pinched off. Channel region can then be formed between the channel pinch-off point and a source region that is set at a low level.

The source-drain saturation current of the third PMOS transistor 213 and the fourth PMOS transistor 214 in the read operation depends on the saturation mobility of the carriers in the channel region. The channel region can be near the source region, the stress in the source region can be a tensile stress, and the transfer transistor can be a PMOS transistor. Therefore, the source-drain saturation current of the third PMOS transistor 213 and the fourth PMOS transistor 214 in the read operation can be reduced, e.g., smaller than the source-drain saturation current of a conventional MOS transistor.

On the other hand, the read margin of the SRAM memory cell can depend on a ratio between the source-drain saturation current of the pull-down NMOS transistors (e.g., the first NMOS transistor 221 and the second NMOS transistor 222) and the source-drain saturation current of the transfer PMOS transistors (e.g., the third PMOS transistor 213 and the fourth PMOS transistor 214). Since the source-drain saturation current of the transfer PMOS transistors can become smaller, the read margin of the SRAM memory cell can become larger. Stability of the read operation of the SRAM memory cell can be increased.

In a write operation of the SRAM memory, a current can flow from the first storage node 241 or the second storage node 242 that is set at a high level to the first bit line BL or the second bit line BLB that is set at a low level. In the write operation, the channel region can be near the drain region, the stress in the drain region can be a compressive stress, and the transfer transistor can be a PMOS transistor. Therefore, the source-drain saturation current of the third PMOS transistor 213 and the fourth PMOS transistor 214 in the write operation can be increased, e.g., larger than the source-drain saturation current of a conventional MOS transistor.

On the other hand, the write margin of the SRAM memory cell depends on a ratio between the source-drain saturation current of the transfer PMOS transistors (e.g., the third PMOS transistor 213 and the fourth PMOS transistor 214) and the source-drain saturation current of the pull-up PMOS transistors (e.g., the first PMOS transistor 211 and the second PMOS transistor 212). Since the source-drain saturation current of the transfer PMOS transistors can become larger, the write margin of the SRAM memory cell can become larger. Stability of the write operation of the SRAM memory cell can be increased.

In a specific embodiment where transfer (or pass-gate) PMOS transistors (e.g., the third PMOS transistor 213 and the fourth PMOS transistor 214) are configured in a 6-Transistor SRAM as shown in FIG. 9, an exemplary SiC source can be connected to the internal nodes such as the storage nodes 241 and 242, while an exemplary SiGe drain can be connected to the bit-lines (BL). Large source-to-drain current and small source-to-drain current can thus be provided.

Therefore, using the disclosed MOS transistor (e.g., having a channel region of an asymmetric stressing layer) as a transfer transistor in an SRAM memory cell circuit can allow both the read margin and the write margin of the SRAM memory cell to be increased at the same time. Stability of the SRAM memory cell can be increased.

In this manner, the disclosed MOS transistor can include a semiconductor substrate, a gate structure formed on a surface of the semiconductor substrate, a source region formed in the semiconductor substrate on one side of the gate structure, and a drain region formed in the semiconductor substrate on the other side of the gate structure. A stress in a channel region formed between the source region and the drain region can be gradually varied from a compressive stress to a tensile stress (or from a tensile stress to a compressive stress) from one end of the channel region near the source region to one end of the channel region near the drain region. The stress in the channel region of the MOS transistor can be asymmetric. Therefore, the source-drain saturation current of the MOS transistor can be different in a different current direction.

In the disclosed SRAM memory cell circuit, the stress in the channel region of a transfer transistor can be asymmetric. This can allow the source-drain saturation current of the transfer transistor in a write operation to be increased and, at the same time, to allow the source-drain saturation current of the transfer transistor in a read operation to be decreased. Both the read margin and the write margin of the SRAM memory cell can be increased. Read-write stability of the SRAM memory cell can be increased.

For example, for a PMOS asymmetric pass gate, a compressive stressing layer (e.g., a SiGe layer) can be formed in drain, while a tensile stressing layer (e.g., a SiC layer) can be formed in source, leading to large source-to-drain current and small source-to-drain current. In another example, for an NMOS asymmetric pass gate, a tensile stressing layer (e.g., a SiC layer) can be formed in drain, while a compressive stressing layer (e.g., a SiGe layer) can be formed in source, leading to large source-to-drain current and small source-to-drain current.

It should be noted that the scope of the present disclosure is not intended to be limited by the embodiments described above. Other applications, advantages, alternations, modifications, or equivalents to the disclosed embodiments are obvious to those skilled in the art and within the scope of the present disclosure.

What is claimed is:

1. A transistor comprising:
a semiconductor substrate;
a gate structure disposed on the semiconductor substrate;
a source region disposed in the semiconductor substrate on one side of the gate structure;
a drain region disposed in the semiconductor substrate on an other side of the gate structure, wherein one of the source region and the drain region includes a tensile stressing layer and an other of the source region and the drain region includes a compressive stressing layer; and
a channel region between the source region and the drain region, wherein the channel region has a first end contacting only the tensile stressing layer and a second end contacting only the compress stressing layer to generate an asymmetric stress in the channel region and the tensile stressing layer and the compress stressing layer are symmetrically configured on both sides of the gate structure, wherein the asymmetric stress gradually varies from the first end to the second end, wherein the first end contacting the tensile stressing layer provides a largest saturation mobility of electrons in the channel region and the second end contacting the compress stressing layer provides a largest saturation mobility of holes in the channel region, and in a middle point of a width of the channel region, each of the compressive stress and the tensile stress becomes zero.

2. The transistor of claim 1, wherein a sidewall of each of the compressive stressing layer and the tensile stressing layer protrudes toward the channel region.

3. The transistor of claim 1, wherein each of the compressive stressing layer and the tensile stressing layer is doped with a p-type impurity ion or an n-type impurity ion.

4. The transistor of claim 1, wherein the compressive stressing layer includes a silicon germanium layer and the tensile stressing layer includes a silicon carbide layer.

5. The transistor of claim 4, wherein the silicon carbide layer has a carbon concentration ranging from about 0% to about 50% by mole percentage of a total silicon carbide layer.

6. The transistor of claim 4, wherein the silicon germanium layer has a germanium concentration ranging from about 0% to about 70% by mole percentage of a total silicon germanium layer.

7. A method of forming a transistor comprising:
providing a semiconductor substrate;
forming a gate structure on the semiconductor substrate;
forming a tensile stressing layer in the semiconductor substrate on one side of the gate structure as one of a source region and a drain region; and
forming a compressive stressing layer in the semiconductor substrate on an other side of the gate structure as an other of the source region and the drain region to provide the transistor with a channel region,
wherein the channel region has a first end contacting only the tensile stressing layer and a second end contacting only the compress stressing layer to generate an asymmetric stress that gradually varies from a tensile stress to a compress stress in the channel region, and the tensile stressing layer and the compress stressing layer are symmetrically configured on both sides of the gate structure, and wherein the first end contacting the tensile stressing layer provides a largest saturation mobility of electrons in the channel region and the second end contacting the compress stressing layer provides a largest saturation mobility of holes in the channel region, and in a middle point of a width of the channel region, each of the compressive stress and the tensile stress becomes zero.

8. The method of claim 7, wherein the forming of the tensile stressing layer and the forming of the compressive stressing layer include:
   forming a first groove in the semiconductor substrate on the one side of the gate structure;
   forming a second groove in the semiconductor substrate on the other side of the gate structure;
   filling the first groove with a silicon carbide layer; and
   filling the second groove with a silicon germanium layer.

9. The method of claim 8, wherein one or both of the silicon carbide layer and the silicon germanium layer are formed by a selective epitaxy.

10. The method of claim 9, further comprising an in-situ doping of p-type or n-type impurity ions.

11. The method of claim 7, wherein
   forming the tensile stressing layer includes implanting carbon ions into the semiconductor substrate on the one side of the gate structure to form the tensile stressing layer, and
   forming the compressive stressing layer includes implanting germanium ions into the semiconductor substrate on the other side of the gate structure to form the compressive stressing layer.

12. The method of claim 7, further including implanting p-type or n-type impurity ions into each of the compressive stressing layer and the tensile stressing layer, after forming the compressive stressing layer and the tensile stressing layer.

13. An SRAM memory cell circuit comprising:
   a first transfer transistor including a gate electrically connected to a word line, a source electrically connecting to a first storage node, and a drain electrically connecting to a first bit line;
   a second transfer transistor including a gate electrically connected to the word line, a source electrically connecting to a second storage node, and a drain electrically connecting to a second bit line, wherein each of the first transfer transistor and the second transfer transistor includes:
   a channel region between the source and the drain, wherein:
   one of the source and the drain includes a tensile stressing layer and an other of the source and the drain includes a compressive stressing layer,
   the channel region has a first end contacting only the tensile stressing layer and a second end contacting only the compress stressing layer to generate an asymmetric stress that gradually varies from a tensile stress to a compressive stress in the channel region from the first end to the second end of the channel region to allow both a read margin and a write margin of the SRAM memory cell to be increased at a same time, wherein the tensile stressing layer and the compress stressing layer are symmetrically configured on both sides of the gate structure, and in a middle point of a width of the channel region, each of the compressive stress and the tensile stress becomes zero.

14. The circuit of claim 13, wherein
   a source region of each of the first transfer transistor and the second transfer transistor includes a compressive stressing layer including a silicon germanium layer, and
   a drain region of the first transfer transistor and the second transfer transistor includes a tensile stressing layer including a silicon carbide layer.

15. The circuit of claim 14, wherein a sidewall of each of the compressive stressing layer and the tensile stressing layer protrudes toward the channel region.

16. The circuit of claim 14, wherein the silicon germanium layer or the silicon carbide layer is doped with n-type impurity ions.

17. The circuit of claim 13, wherein
   a source region of each of the first transfer transistor and the second transfer transistor includes a tensile stressing layer including a silicon carbide layer, and
   a drain region of each of the first transfer transistor and the second transfer transistor includes a compressive stressing layer including a silicon germanium layer.

18. The circuit of claim 17, wherein each of the compressive stressing layer and the tensile stressing layer has a sidewall protruding toward the channel region and is doped with p-type impurity ions.

19. The circuit of claim 13, further including:
   a first PMOS transistor;
   a second PMOS transistor;
   a first NMOS transistor; and
   a second NMOS transistor; wherein
   the first storage node electrically connects a gate of the second PMOS transistor, a gate of the second NMOS transistor, a drain of the first PMOS transistor, a drain of the first NMOS transistor and the source of the first transfer transistor;
   the second storage node electrically connects a gate of the first PMOS transistor, a gate of the first NMOS transistor, a drain of the second PMOS transistor, a drain of the second NMOS transistor, and the source of the second transfer transistor;
   sources of the first and second PMOS transistors are electrically connected to a power supply terminal; and
   sources of the first and second NMOS transistor are electrically connected to a ground terminal.

* * * * *